United States Patent
Shibata et al.

(10) Patent No.: US 7,273,536 B2
(45) Date of Patent: Sep. 25, 2007

(54) CONDUCTIVE DIAMOND ELECTRODE AND PROCESS FOR PRODUCING THE SAME

(75) Inventors: Tomoyasu Shibata, Fujisawa (JP); Masashi Hosonuma, Fujisawa (JP); Tsuneto Furuta, Fujisawa (JP)

(73) Assignee: Permelec Electrode Ltd., Kanagawa (JP)

( * ) Notice: Subject to any disclaimer, the term of this patent is extended or adjusted under 35 U.S.C. 154(b) by 222 days.

(21) Appl. No.: 11/062,493

(22) Filed: Feb. 23, 2005

(65) Prior Publication Data
US 2005/0186345 A1 Aug. 25, 2005

(30) Foreign Application Priority Data
Feb. 24, 2004 (JP) .................... P. 2004-048460

(51) Int. Cl.
*C25B 11/12* (2006.01)
(52) U.S. Cl. .............. 204/294; 204/280; 204/290.01; 427/249.1; 427/249.8; 427/249.12; 427/294; 427/299; 427/307; 427/309; 427/314; 427/318; 205/207; 205/208; 205/210; 205/212; 205/229; 205/316

(58) Field of Classification Search ............... 204/294, 204/280, 290.01; 205/205, 206, 209, 210, 205/212, 229, 316, 322, 207, 208; 427/249.1, 427/249.8, 249.12, 294, 299, 307, 309, 314, 427/318
See application file for complete search history.

(56) References Cited

U.S. PATENT DOCUMENTS
6,533,916 B1    3/2003 Puetter et al.
2005/0014066 A1*  1/2005 Shimamune ............. 429/231.5

FOREIGN PATENT DOCUMENTS
EP    0 549 801 A1    7/1993

OTHER PUBLICATIONS
M. Fryda et al. "Fabrication and application of Diachem electrodes" (2003), Diamond and Related Materials 12, vol. 12, No. 10-11, pp. 1950-1956.
European Search Report dated Oct. 28, 2005.

* cited by examiner

*Primary Examiner*—Bruce F. Bell
(74) *Attorney, Agent, or Firm*—Sughrue Mion Pllc.

(57) ABSTRACT

A conductive diamond electrode including an electrode substrate comprising a material selected from the group consisting of a valve metal and an alloy based on the valve metal, at least a surface of the metal or alloy having been subjected to plasticization processing, or heat treatment in vacuum or inert atmosphere; and a conductive diamond film formed on the plasticization processed surface of the electrode substrate. When the electrode substrate is subjected to plasticization processing and heat treatment, peeling resistance of the conductive diamond film is improved, thereby an electrode life is prolonged.

7 Claims, 1 Drawing Sheet

CONDUCTIVE DIAMOND ELECTRODE AND PROCESS FOR PRODUCING THE SAME

FIELD OF THE INVENTION

The present invention relates to a conductive diamond electrode and a process for producing the same. More particularly, the present invention relates to a conductive diamond electrode in which conductive diamond which is an electrode material applied to a surface of an electrode substrate has good adhesion to the electrode substrate, and a process for producing the same. The conductive diamond electrode of the present invention can efficiently perform electrolysis of objective substances contained in waste water or drinking water, which adversely affect human bodies and environment. Further, the conductive diamond electrode has excellent durability and high oxidizing ability as an anode for industrial electrolysis.

BACKGROUND ART

Electrolysis process can generate hydrogen, oxygen, ozone, hydrogen peroxide and the like in aqueous solution systems by controlling chemical reaction on an electrode surface utilizing clean electric energy, and is a basic technology widely used in electrolysis of sodium chloride, electroplating, extraction of metals, and the like as industrial electrolysis. Recently, the electrolysis process is being utilized for waste water treatment because it is possible to indirectly decompose organic pollutants, or to adsorb the pollutants onto an electrode, thereby directly electrolyzing them.

On the other hand, it is known that according to anodic oxidation reaction in electrolysis, oxidizers (for example, effective chlorine and ozone) effective for water treatment are formed and that active species such as an OH radical are partially generated. Water containing them is generally used as a name such as active water, functional water, ionic water, and sterile water (Basic Knowledge of Strongly Acidic Electrolyzed Water, Ohm Co.).

The electrolysis process is widely put to practical use. However, it is pointed out that objective reaction does not sufficiently proceed depending upon electrode materials. In general, according to anodic oxidation reaction of electrolysis in an aqueous solution, the electrolysis proceeds with water as a raw material, to obtain an electrolytic product. However, in many cases, in electrode catalysts having high reactivity against discharge of water, oxidation of other co-existing substances does not readily proceed.

As materials of an electrode (anode) for electrolysis to be used for carrying out oxidation, lead oxide, tin oxide, platinum, DSA, carbon, and the like are used. Materials that can be used as an electrode substrate are required to have a long life and have corrosion resistance such that staining on the treated surface does not occur. Materials for an anode collector are limited to valve metals such as titanium and alloys thereof Electrode catalysts are also limited to noble metals such as platinum or iridium, and oxides thereof Even if such an expensive material is used, it is known that when an electric current is applied, the material is exhausted corresponding the current density or current-carrying time and eluted into an electrolytic solution. Thus, electrodes having more excellent corrosion resistance are being desired.

Graphite and amorphous carbon materials have hitherto been used as an electrode material. However, these materials are markedly exhausted, in particular, under anodic polarization. Diamond is excellent in thermal conductivity, optical transmission, and durability against high temperatures and oxidation. In particular, since it is possible to control electric conductivity by doping, diamond is promising as a semiconductor device or energy conversion element.

Recently, it is reported that diamond has stability as an electrochemical electrode in an acidic electrolytic solution, and it is suggested that diamond is far excellent as compared with other carbon materials (see Swain et al., *Journal of Electrochemical Society*, Vol. 141, 3382-(1994)). Basic electrochemical properties of diamond are described in detail in *Electrochemistry and Industrial Physical Chemistry*, p389, Vol. 67, No.4 (1999).

U.S. Pat. No. 5,399,247 suggests that organic waste water can be decomposed using diamond as an anode material. JP-A-2000-226682 proposes a method of carrying out water treatment using conductive diamond as an anode and a cathode. Further, JP-A-2000-254650 proposes a method of carrying out water treatment using conductive diamond as an anode and a gas diffusion cathode for generating hydrogen peroxide as a cathode.

Any industrial application of a diamond electrode in high potential region under high current density has not yet been reported. However, recently, it is reported that the diamond electrode is inert against decomposition reaction of water and forms ozone in addition to oxygen (see JP-A-11-269685).

From these researches, according to the electrolysis process using diamond as an electrode, an enhancement of the efficiency is expected as compared with the case using a conventional electrode. On the other hand, improvements have been desired from the following viewpoint of practical use.

As a method of preparing diamond films, a hot filament CVD method, a microwave plasma CVD method, a plasma arc jet method, a PVD method, and the like are developed. In the CVD method as a general production method of diamond, since a high-temperature reduction step of 700° C. or higher is employed, it is required that a coefficient of thermal expansion of a substrate is closed to that of diamond. For substrates of a diamond electrode, metallic silicon whose coefficient of thermal expansion is closed to that of diamond is usually used. This metallic silicon is low in mechanical strength such as brittleness, and its size is limited, so that it is difficult to make it large in size. Since the shape of electrodes to be used for industrial electrolysis is complicated, it is also preferred to use metallic substrates that are easy for processing and high in mechanical strength. In particular, as metals that are stable in acidic solutions in an anodic potential region, valve metals such as titanium, zirconium or niobium, or its alloy can be used.

Hydrogen atmosphere at high temperature region of 700° C. or higher is formed in a reaction vessel, and there is the possibility that general metal materials undergo hydrogen brittleness. It is investigated to use niobium or tantalum substrate, considering that in the use thereof, hydrides reversely isolate under such conditions, and absorption amount of hydrogen decreases, thereby risk of brittleness is avoided. Anti-corrosion of niobium is slightly inferior to that of tantalum, but is excellent in specific strength and costs. It is necessary for titanium and zirconium to add steps of maintaining in vacuum at high temperature region and dehydrogenating, in order to avoid hydrogen brittleness.

There is a scratching method as a pre-treatment generally conducted in order to securely form a diamond film on a substrate. Different from general vacuum deposition, diamond nuclei do not substantially generate on a mirrorpolished substrate. For generation of nuclei, sites having high energy, such as transformation or step, to be starting point are required. Therefore, scratching treatment is generally conducted using diamond or SiC particles, having high hardness. At the initial stage, a manual polishing by diamond paste having a particle diameter of submicron meter to several tens μm was conducted as the scratching treatment. At present, the scratching method is improved, and ultrasonic treatment is established, in which an ultrasonic washer is used, about 1 g of particles is introduced into about 20 cc of alcohol, and the washer is lightly beaten such that particles vibrate while rolling, thereby forming scratches (S. Yugo, *New Diamiond*, Vol. 7, No. 1, 7 (1991)). The maximum nucleus generation density obtained by this technique is about $10^9/cm^2$ by microwave plasma CVD method.

From the analysis of this ultrasonic scratching method, a bias method (electric field treatment) has been developed by Yugo et al (S. Yugo, T. Tanai, T. Kimura and T. Muto: *Appl. Phys. Lett.*, Vol. 58, No. 11, p1038 (1991)). This method is as follows. In plasma CVD method, by applying a direct current voltage of about −100V, surface washing is conducted by hydrogen ions or the like, defects to be nucleus generation site, such as transformation or step, are introduced, amorphous carbon other than diamond is removed, migration of carbon ions is activated, and formation of carbon cluster is accelerated. This enables the nucleus generation density to be about $10^{11}/cm^2$.

On the other hand, a seeding method was invented. This method appears to be derived from the phenomena that diamond particles themselves or diamond particles remained in the scratching treatment form nuclei, and diamond film easily grows. This method conducts formation of CVD diamond film after previously applying nanodiamond particles having a particle diameter of 1-50 nm that are easy to apply as a sol (dispersed colloidal solution) to a substrate. At the initial stage, in the seeding method, investigation of coating method proceeded from dip method or spinner method. Recently, by using nanodiamond particles having an average particle diameter of 5-10 nm, and ultrasonic vibration treatment having a recoagulation suppression effect of fine particles in dispersed colloidal solution and an embedding effect of fine particles into a substrate, the nucleus generation density having high density 100 times ($10^{11}/cm^2$) or more of that in the scratching treatment has been obtained (H. Kurokawa, et al: Electric Society, *Metal and Ceramics Research Meeting Materials*, Vol. MC-97-3, 12-18 (1997)).

From the standpoint of the result, the scratching treatment and seeding treatment, using both diamond particles and ultrasonic vibration are very similar treatment, and are frequently confused. The great difference is improvement of nucleus generation density proceeded with diamond particle diameter in time series.

As a pre-treatment of a substrate to be subjected to the seeding treatment, in many cases a metallic silicon substrate is generally subjected to only acid washing for the purpose of removing oxide film or oxide layer formed in the atmosphere. Valve metals suitable for use in electrolysis are subjected to sandblast treatment prior to acid washing. The reasons for this are that unevenness of several μm to several tens μm is formed on the surface a substrate to absorb difference in coefficient of thermal expansion between the substrate and diamond when forming CVD diamond film, thereby preventing peeling of the film from the substrate, and actual electrolysis current density decreases.

In order to provide a stable anode, it is performed to maintain durability of a substrate. For the purposes of obtaining adhesion of a diamond film to a substrate and protecting the substrate, there is the case that it is preferable to form various interlayers on the substrate surface (see JP-A-9-268395). It is disclosed that the effect of the interlayer is a basic technique for prolonging the life of a noble metal oxide electrode in an acidic electrolytic bath (see JP-B-60-21232 and JP-B-60-22074). However, even if such an oxide interlayer is formed, since radicals such as hydrogen generate under CVD diamond synthesis conditions, the greater part of the interlayer is reduced, and therefore, it is not simple to apply the subject technique.

If the interlayer is a carbide originated from the substrate, it is expected to increase adhesion of diamond film from the relationships between substrate and carbide grown from the substrate, and between carbide and diamond generated from the carbide as a nucleus. However, actually in many cases the carbide is inferior in corrosion resistance to an oxide when voltage is applied to an anode in a strongly acidic solution (For example, in the case of NbC, see ЛЕСНИКОВА К П, ФРЕЙД М Х, РЫБИНА Г Л: Zashch Met, 458-461 (198705-198706)). Carbide is liable to be formed on a substrate contacting hydrocarbon radicals or diamond in high temperature atmosphere. Therefore, it is necessary to pay attention when using as an anode.

However, depending on the applied field, even such an improved diamond electrode has poor life, and cannot answer the problems. As a result of investigation of this cause, it has been confirmed that a large-sized electrode involves difference in coefficient of thermal expansion and scattering in quality of diamond due to heterogeneity of CVD device (precipitation of non-diamond component), and defects such as pinholes or cracks unavoidably occur.

To obtain a diamond film having good film-forming property, i.e., a uniform and defect-free diamond film, it is an important condition that generation of high density nucleus can efficiently be conducted with good reproducibility by controlling nucleus generation.

SUMMARY OF THE INVENTION

Under the above situation, electrolysis life in practical level has not been achieved by the conventional method, and it has been necessary to further develop a pre-treatment method of a diamond electrode substrate capable of utilizing in industrial electrolysis.

The present invention has been made to overcome the conventional problems.

Accordingly, one object of the present invention is to provide a conductive diamond electrode having excellent durability, comprising an electrode substrate and a conductive diamond film closely contacted therewith.

Another object of the present invention is to provide a process for producing the conductive diamond electrode.

The conductive diamond electrode according to the present invention comprises:

an electrode substance comprising a material selected from a valve metal or an alloy based on the valve metal, at least a surface of the metal or alloy having been subjected to plasticization processing, or heat treatment in vacuum or inert atmosphere, and a conductive diamond film formed on the plasticization processed surface of the electrode substrate.

The process for producing the conductive diamond electrode according to the present invention comprises:

subjecting at least a surface of an electrode substrate to plasticization processing, the electrode substrate comprising a material selected from a valve metal selected from the group consisting of niobium, tantalum, titanium and zirconium, and an alloy based on the valve metal;

subjecting the electrode substrate to heat treatment in vacuum or inert atmosphere; and forming a conductive diamond film on the surface of the heat-treated electrode substrate.

BRIEF DESCRIPTION OF THE DRAWING

The attached FIGURE is SEM photograph (magnification: 6,000) showing a cross section of a substrate sample having nanopits present therein in the Reference Example.

DETAILED DESCRIPTION OF THE INVENTION

Figure 1:
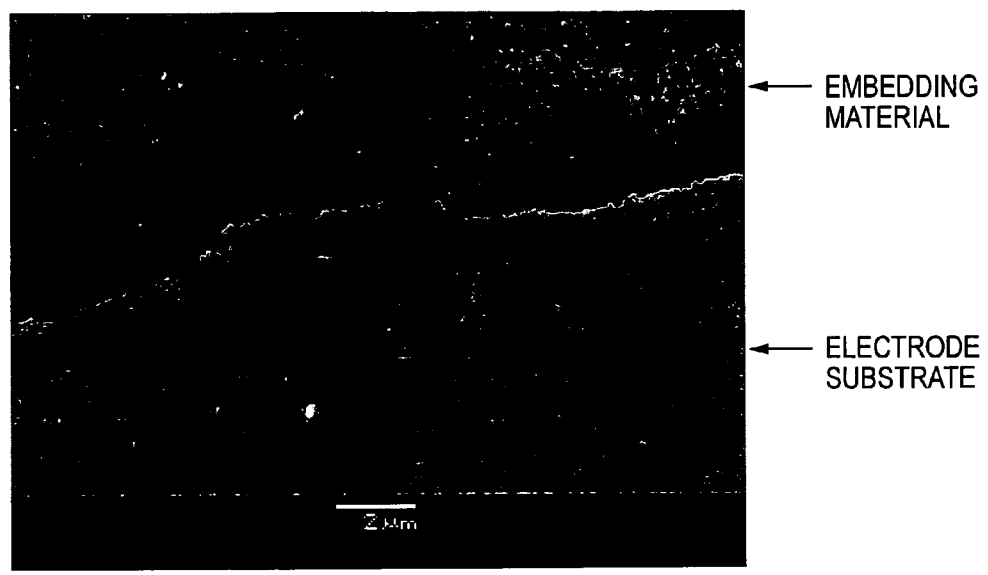

The present invention is described in detail below.

Prior to forming a conductive diamond film on a surface of an electrode substrate, at least the surface of the electrode substrate is subjected to plasticization processing, and heat treatment in vacuum or inert atmosphere.

A material for the electrode substrate that can be used is a valve metal such as titanium, zirconium, niobium or tantalum, or an alloy based on the metal valve. Niobium or an alloy based on niobium is preferably used as the material for electrode substrate.

The electrode substrate is subjected to plasticization processing. The plasticization processing that can be used is a processing which is conducted to the whole of a substrate, such as tensile processing, compression, bending, torsion or rolling, and a processing which involves plastic deformation in the vicinity of the surface of substrate, i.e., in the depth up to several hundred Em from the surface, such as blasting. From the point of the processing to improve close contact of the substrate with the conductive diamond film formed on the surface thereof, it is sufficient to obtain the processing effect only in the vicinity of the substrate surface. From this standpoint, blasting is efficient. It is preferable that the surface of electrode substrate is subjected to plastic deformation over a certain depth by blasting.

The blasting is mainly the following treatment method. Particles of ceramics, iron or the like are sprayed to a surface of metal or alloy from a tip of a drawn nozzle together with compressed air or high pressure water to impart impact. As a result, plastic deformation occurs, thereby forming fine unevenness, corresponding to particle diameter or pressure. This method is also used as a method of removing foreign materials on a surface. Where shape of particles used is sphere (shot) in the above method, this method is called a "peening" method. This method is mainly conducted to perform processing and curing of the surface, rather than formation of unevenness on the surface. In the sense that lattice defects such as pore or transformation are formed on a surface layer, this method is theoretically the same treatment as blasting.

When plasticization processing, particularly blasting, is applied to the electrode substrate surface, clear unevenness is formed on the surface to form a roughened surface, and by a diamond coating by CVD or the like conducted after heat treatment, bonding strength of the resulting diamond coating film to the electrode substrate is increased.

The valve metal has a coefficient of thermal expansion apart from that of diamond, and therefore, adhesion as obtained in silicon is not expected in the valve metal. Silicon can form diamond coating film even on a surface close to a mirror surface if scratching treatment is applied thereto. However, the valve metal has the possibility to cause peeling. To suppress the peeling, clear unevenness is formed on a substrate surface to divide the surface into fine faces having substantially many angles. As a result, inner stress of the diamond film is divided small, thereby suppressing peeling. Even if partial peeling occurs, it is possible to prevent further enlargement of peeling. Unevenness having square corners, rather than round corners, has great effect in that continuity of the film is cut off.

Further, in actually conducting electrolysis of a solution using the diamond coating film, there is a subsidiary effect that electrolysis current density can be decreased by increase of surface unevenness, i.e., enlargement of surface area contacting a solution.

After conducting blasting, it is possible to further conduct acid washing or alkali washing for the purpose of high surface cleaning. It is considered that the substrate surface having been subjected to blasting is contaminated with deposition thereon of blast particles stuck thereinto, fine powder of the crushed blast particles, and fine powder of Fe, Ni, Cr and the like that are stainless steel components mainly used as inner structure materials of a blasting apparatus. Those contaminants adversely affect properties of the surface obtained. For example, the contaminants are partially alloyed by the subsequent heat treatment. The residual fine particles remain on the surface in the form of a mixture with nanodiamond particles by the subsequent seeding treatment. Therefore, it is proper to previously remove the fine particles by washing as much as possible.

It is considered that an oxide as an impurity has small diamond nucleus generation density, and iron-based metal has a catalytic action which decomposes hydrocarbon raw material, so that amorphous carbon or graphite is liable to form. To remove such impurities, washing such as high pressure water washing, ultrasonic washing, steam washing, scrubbing, acid washing or alkali washing is conducted. The acid washing is conducted with non-oxidizing acid such as hydrochloric acid, sulfuric acid or oxalic acid, or mixtures thereof at a temperature of its boiling point or near the boiling point, or is conducted by adding an oxidizing agent such as nitric acid or hydrogen peroxide to hydrofluoric acid at a temperature near room temperature. Electrolytic oxidation may be conducted in an acid or alkali solution. As a finishing, the substrate is rinsed with pure water, and then sufficiently dried.

After the plasticization processing, or after the subsequent acid or alkali washing, the substrate is subjected to heat treatment in vacuum or inert atmosphere.

In the heat treatment, it is desirable to eliminate as much as possible each gas of oxygen, nitrogen, hydrogen or carbon that may impair a preferable surface shape described hereinafter, or a gas containing those elements, by reacting with the valve metal surface. When the heat treatment is conducted in vacuum, the degree of vacuum is preferably about $10^{-3}$ to $10^{-5}$ Pa.

The substrate is molded and processed into a given shape, and a surface of the substrate is subjected to blasting, and then if necessary, subjected to a treatment such as acid washing. Preferably, the substrate thus treated is hung on a hunger or placed on a mount, and then placed in a furnace to conduct heat treatment therein. After reaching a given temperature, the temperature in the furnace is decreased immediately or after maintaining the temperature for several hours. The heating temperature range is preferably 750-1, 300° C. for niobium, 960-1,600° C. for tantalum, 460-840° C. for titanium, and 530-950° C. for zirconium. Where an alloy based on those metals is used, movement of transformation is generally suppressed by the addition of an element. Therefore, the maintenance time is prolonged according to the proportion of the element added.

Immediately thereafter, diamond coating by CVD method or the like may be conducted. However, if the seeding treatment is conducted with nanodiamond particles having further high nucleus generation density, a conductive diamond film having high adhesion can securely be formed.

The seeding method is conducted, for example, as follows. Nanodiamond particles having an average particle diameter of 1-50 nm in an amount of about 2-5 g are dispersed in 100 cc of pure water or an organic solvent. The substrate obtained above is placed in the resulting colloidal solution in a manner such that a surface to be subjected to electrolysis which is the final object faces upper, or the substrate is hung so as to decrease the area contacting the surrounding wall of a vessel. At least the surface to be electrolyzed is irradiated with ultrasonic wave. The ultrasonic irradiation conditions are 28-100 kHz, 100-300 W and about 5-15 minutes. By the irradiation of ultrasonic wave, the nanodiamond particles can securely be applied to the substrate with good dispersibility.

After conducting a series of such pre-treatments or without conducting those, diamond coating is applied to electrolysis face of the electrode substrate by CVD method, PVD method, deposition method or the like. The representative hot filament CVD method is described below.

Organic materials to be a carbon source, such as alcohol, are maintained in reducing atmosphere in a CVD chamber, and the chamber inside is set to a temperature of 1,800-2,400° C. at which carbon radicals generate. The electrode substrate is arranged in a temperature region (750-950° C.) at which diamond precipitates.

Desirably, organic compound gas concentration to hydrogen is 0.1-10 vol %, supply rate is 0.01-10 liters/min, although varying depending on a dimension of a reaction vessel, and pressure is 15-760 mmHg.

To impart good conductivity to diamond, it is indispensable to add a slight amount of elements having different atomic valency. Content of boron or phosphorus is preferably 1-100,000 ppm, and more preferably 100-10,000 ppm. Boron oxide, phosphorus pentoxide, or the like having low toxicity is preferably used as a starting material compound.

The above-described seeding treatment and the subsequent diamond coating by CVD method can be conducted repeated several times, including the techniques commonly conducted with respect to coating which requires general and many laminations. Coating is completed through steps that cracks or peeling generated by one operation are compensated by the subsequent operations. Assuming that 75% of the area is coated by one operation, the area of $(1-0.25^3)\times 100=98(\%)$ is coated by the operation of three times. It is required that the area to be coated is increased by less operations as possible, and coating is securely conducted. Increasing the number of coating operation and increasing the area peeled by ultrasonic washing involve poor adhesion of diamond coating.

By the combination of blasting and the subsequent vacuum heat treatment, adhesion to diamond film by CVD method is improved, and as a result, the life of diamond electrode can be prolonged. The mechanism is not clear, but it can be considered as follows.

Blasting is that a so-called plasticization processing is applied to only the surface or its vicinity having a depth of several hundred Jim. Plasticization deformation is mainly caused by slip deformation, and unevenness remains on the surface. In this case, transformation or pores grow on the surface layer. When those move much, processing and curing occur. When the above temperature is further elevated by heating, pores near the surface move to the surface and disappear. Transformation that absorbs pores and is mobile moves to the surface, and disappears Slip line generated when plasticizing and deforming at room temperature, and transformation stopped by pin at crystal particle field near the surface move at once to the surface. Active transformation becomes a starting point by heat etching in vacuum, and the circumferential atoms evaporate, thereby forming micropits.

The present invention is that in an electrolysis electrode using conductive diamond from by CVD method or the like as an electrode catalyst, when valve metals such as niobium, tantalum, titanium or zirconium, or their alloys are used as an electrode substrate, the electrode substrate is heated in vacuum or inert atmosphere after subjecting plasticization processing to the vicinity of the surface of the electrode substrate. The heating temperature range is preferably 750-1,300° C. for niobium, 960-1,600° C. for tantalum, 460-840° C. for titanium, and 530-950° C. for zirconium.

Plasticization deformation may be made over the entire substrate. However, it is efficient that blasting or the like is conducted to apply plasticization processing to the vicinity of surface, i.e., to the depth of several hundred μm from the surface.

This heat treatment can improve adhesion of the diamond film by CVD method to a substrate, and also can considerably suppress formation of carbides originated from a substrate, which are considered to unavoidably form a substrate surface in the diamond coating treatment by CVD method.

After the heat treatment, the seeding treatment is conducted and then a diamond film may be formed by CVD method or the like. Further, after the plasticization processing by CVD method or the like, surface washing is conducted for the purpose of removing contaminants such as iron-based elements, and blast particles such as alumina, and then heating treatment can also be conducted.

The present invention is described in more detail by reference to the following examples, but it should be understood that the invention is not construed as being limited thereto. Unless otherwise indicated, all parts, percents, ratios and the like are by weight.

REFERENCE EXAMPLE

Alumina particles of #60 were sprayed to both surfaces of a metal niobium plate having a thickness of 2 mm by compressed air of 0.7 MPa to conduct blasting. The plate was dipped in a nitrohydrofluoric acid aqueous solution containing 20% of nitric acid (HNO3) and 7% of hydrofluoric acid (HF) at room temperature for 100 minutes to decrease the weight of the plate in an amount of 430 g/m$^2$, thereby smoothening the surface thereof The surface layer was eroded in a depth of about 50 μm from the surface. Generally, in the blasting under this condition, a processed layer is present up to a depth of about 100 μm from the surface. Therefore, sufficient processing history remains in the above treatment. The plate was then subjected to ultrasonic washing at 28 kHz and 300 W for 15 minutes in pure water. The metal niobium plate thus treated was placed in an aluminum vessel. The temperature in the vessel was elevated to 1,090° C. at a temperature rising rate of 4° C./min in a vacuum of $10^{-3}$ to $10^{-5}$ Pa. After maintaining the plate at that temperature for 60 minutes, the temperature in the vessel was lowered to room temperature at a temperature lowering rate of 4° C./min. Thus, an electrode substrate sample was prepared.

In order that a cross section of the sample can easily be identified, the substrate sample was embedded in a resin (phenolic resin), and its cross section was observed with SEM. As a result, SEM photograph showing the cross section on which nanopits are present was obtained as shown in the FIGURE. As shown in the accompanying photograph, it is seen that many nanopits are present. Large undulation is due to blasting.

It was calculated from the measurement of three regions on the cross sectional photograph that, assuming that nanopore diameter is 30-150 nm, and nanopores are uniformly present on the surface, the nanopore density is $1.5 \times 10^9/cm^2$.

The nanopore has a size such that several to several ten nanodiamonds for seeding are included. Therefore, it was found that the nanopores can be present on the surface in far stable state as compared with mere adhesion on the blast surface.

It is considered that on the area not covered with nanodiamond particles for seeding, the nanopores act as a nucleus generation site during CVD similar to scratches due to the scratching treatment.

However, the degree of generation of such nanopores varies depending on the difference in heat treatment temperature. It is therefore considered that difference inherently causes in the seeding treatment and the subsequent diamond coating by CVD method, ultimately in electrolysis life.

EXAMPLE 1

Alumina particles of #60 were sprayed to both surfaces of a metal niobium plate having a size of 30 mm×30 mm and a thickness of 2 mm by compressed air of 0.7 MPa to conduct blasting. The plate was subjected to ultrasonic washing at 28 kHz and 300 W for 15 minutes in pure water, and then dried. The plate was immediately inserted in a vacuum furnace. While maintaining the vacuum of $10^{-3}$ to $10^{-5}$ Pa, the temperature in the furnace was elevated to 750° C. at a temperature rising rate of 4° C./min. The plate was maintained at the temperature for 10 hours (Example 1-1), and then cooled to room temperature at a rate of 4° C./min to prepare a substrate sample. Similarly, substrate samples were prepared such that the temperature elevated to 1,090° C. and then maintained for 1 hour (Example 1-2), and the temperature was elevated to 1,300° C. and then maintained for 1 minute (Example 1-3).

Each of the substrate samples was subjected to a seeding treatment in the following manner.

2 g of nanodiamond particles having an average particle diameter of 5 nm was introduced into 100 ml of ethanol, and the resulting mixture was sufficiently mixed to disperse the particles into ethanol. The substrate sample obtained above was placed in the resulting colloidal solution in a manner such that the sample was hung up so as to decrease the portion contacting the surrounding vessel. Ultrasonic irradiation of 100 kHz and 100 W was conducted for 5 minutes. The substrate sample was immediately taken out of the solution, and sufficiently dried while gradually elevating the temperature to 60° C.

Using each of those substrate samples as a substrate, diamond was directly precipitated on the substrate using hot filament CVD apparatus under the following conditions. The substrate was mounted on hot filament CVD apparatus. Ethyl alcohol was used as a carbon source, and boron oxide was dissolved in ethyl alcohol in a concentration of 1,500 ppm. Hydrogen gas was flown at a rate of 0.01 liter/min. Part of hydrogen gas was by-passed into a carbon source vessel to make ethyl alcohol gas concentration to hydrogen be 1 vol %. While flowing those gases through the apparatus, electric current was flown through the filament, and the temperature was elevated to a temperature of 1,800-2,400° C. at which carbon radicals generate. When temperature of the substrate just under the filament was measured, it was found to be 800° C. After continuing CVD operation for 5 hours, the substrate was taken out from the apparatus. Thus, a conductive diamond electrode was prepared.

It was confirmed by Raman spectroscopic analysis that diamond film was deposited. From an electron microscopic photograph, a thickness of the diamond film was 5 μm. Further, by X-ray diffraction, diffraction peaks of diamond and metal niobium of the substrate were confirmed, and slight diffraction peaks of $Nb_2C$ and NbC were confirmed with respect to niobium carbide.

Peeled portion was not observed on the diamond film by visual observation or handling. Tape test was conducted without forming cross-hatches or X cuts, simplifying JIS K5400. As a result, peeled portion was not observed.

The conductive diamond electrode thus prepared was used as an anode by adjusting its area to 1 $cm^2$ by a gasket, a zirconium plate was used as a counter electrode, an electrode distance was 1 cm, and electrolysis was conducted under the conditions of 150 g/linter of sulfuric acid, 60° C. and 3 $A/cm^2$. As a result, stable cell voltage was maintained, showing 3,290 hours (Example 1-1), 4,680 hours (Example 1-2) and 3,020 hours (Example 1-3). Thus, it was confirmed that each electrode can be used practically over a sufficiently long period of time.

COMPARATIVE EXAMPLE 1

A sample was prepared in the same manner as in Example 1, except that vacuum heat treatment was not conducted. The same results as in Example 1 were obtained on Raman spectroscopic analysis and electron microscopic photograph. The result of X-ray diffraction was substantially the same as in Example 1, but difference appeared in that large diffraction peak of NbC was recognized.

The adhesion was the same as in Example 1, except that slight peeling was visually observed on the peripheral portion.

Electrolysis was conducted in the same manner as in Example 1. As a result, cell voltage rapidly rose at 690 hours, the time of which was practically insufficient electrolysis time. After stopping the operation, the electrode was observed. As a result, peeling of the diamond film proceeded, and the substrate eroded.

EXAMPLE 2

Alumina particles of #60 were sprayed to both surfaces of a metal niobium plate (substrate sample) having a size of 30 mm×30 mm and a thickness of 2 mm by compressed air of 0.7 MNa to conduct blasting.

The substrate plate was dipped in an aqueous solution containing 5% of hydrofluoric acid (HF) and 2% of hydrogen peroxide ($H_2O_2$) at 60° C. for 25 minutes. The plate was then subjected to ultrasonic washing at 28 kHz and 300 W for 15 minutes in pure water, and dried. In EPMA analysis of the surface separated performed, blast particles and other contaminants were not observed. The state was observed that clearly square unevenness formed by blasting was slightly round.

The sample substrate thus treated was immediately placed in a vacuum furnace. While maintaining vacuum of $10^{-3}$ to $10^{-5}$ Pa, the temperature in the furnace was elevated to 1,090° C. at a rate of 4° C./min, this temperature was maintained for 1 hour, and the temperature was down to room temperature at a rate of 4° C./min.

The seeding treatment was conducted in the same manner as in Example 1.

The same results as in Example 1 were obtained on Raman spectroscopic analysis and electron microscopic photograph. The result of X-ray diffraction was substantially the same as in Example 1, but difference appeared in that diffraction peak of NbC was the extent of trace.

The adhesion was the same as in Example 1, except that slight peeling was visually observed on the peripheral portion.

Electrolysis was conducted in the same manner as in Example 1. As a result, stable cell voltage was maintained for 2,540 hours. Thus, it was confirmed that the electrode can be used practically over a sufficiently long period of time.

COMPARATIVE EXAMPLE 2

Diamond electrode was prepared in the same manner as in Example 2, except that vacuum heat treatment was not conducted.

Adhesion was very poor, and the diamond film peeled over the substantially entire surface. The coating only remained slightly on projected portions and the outer peripheral portion of the substrate, and the exposed metal niobium colored in pale yellow.

It should further be apparent to those skilled in the art that various changes in form and detail of the invention as shown and described above may be made. It is intended that such changes be included within the spirit and scope of the claims appended hereto.

This application is based on Japanese Patent Application No. 2004-048460 filed Feb. 24, 2004, the disclosure of which is incorporated herein by reference in its entirety.

What is claimed is:

1. A conductive diamond electrode comprising:
   an electrode substrate comprising a material selected from a valve metal selected from the group consisting of niobium, tantalum, and zirconium, and an alloy based on the valve metal, at least a surface of the metal or alloy having been subjected to plasticization processing and heat treatment in vacuum or inert atmosphere, and
   a conductive diamond film formed on the plasticization processed surface of the electrode substrate.

2. The conductive diamond electrode as claimed in claim 1, wherein the electrode substrate is metal niobium or an alloy based on niobium.

3. A process for producing the conductive diamond electrode, which comprises:
   subjecting at least a surface of an electrode substrate to plasticization processing, the electrode substrate comprising a material selected from a valve metal selected from the group consisting of niobium, tantalum, and zirconium, and an alloy based on the valve metal;
   subjecting the electrode substrate to heat treatment in vacuum or inert atmosphere; and
   forming a conductive diamond film on the surface of the heat-treated electrode substrate.

4. The process as claimed in claim 3, wherein a seeding treatment conducted between the heat treatment and the conductive diamond film formation.

5. The process as claimed in claim 3, wherein the heat treatment temperature is 750-1,300° C. for niobium, 960-1,600° C. for tantalum, 460-840° C. for titanium, and 530-950° C. for zirconium.

6. The process as claimed in claim 3, wherein the plasticization processing is blasting.

7. The process as claimed in claim 3, wherein after subjecting the electrode substrate to heat treatment, the surface of the electrode substrate contains pits having a diameter of 30-150 nm.

* * * * *

UNITED STATES PATENT AND TRADEMARK OFFICE
CERTIFICATE OF CORRECTION

PATENT NO. : 7,273,536 B2  Page 1 of 1
APPLICATION NO. : 11/062493
DATED : September 25, 2007
INVENTOR(S) : Tomoyasu Shibata, Masashi Hosonuma and Tsuneto Furuta It is certified that error appears in the above-identified patent and that said Letters Patent is hereby corrected as shown below:

Col. 12, Line 28 should read

5. The process as claimed in claim 3, wherein the heat treatment temperature is 750-1,300°C for niobium, 960-1,600°C for tantalum, ~~460-840°C for titanium~~, and 530-950°C for zirconium.

Signed and Sealed this

First Day of April, 2008

JON W. DUDAS
*Director of the United States Patent and Trademark Office*